United States Patent
Bergenek et al.

(10) Patent No.: US 9,842,972 B2
(45) Date of Patent: Dec. 12, 2017

(54) RADIATION-EMITTING SEMICONDUCTOR COMPONENT

(75) Inventors: Krister Bergenek, Regensburg (DE);
Mikael Ahlstedt, München (DE); Ute Liepold, München (DE)

(73) Assignee: OSRAM Opto Semiconductors GmbH (DE)

( * ) Notice: Subject to any disclaimer, the term of this patent is extended or adjusted under 35 U.S.C. 154(b) by 766 days.

(21) Appl. No.: 13/516,848

(22) PCT Filed: Dec. 13, 2010

(86) PCT No.: PCT/EP2010/069509
§ 371 (c)(1),
(2), (4) Date: Jul. 25, 2012

(87) PCT Pub. No.: WO2011/085889
PCT Pub. Date: Jul. 21, 2011

(65) Prior Publication Data
US 2012/0286313 A1    Nov. 15, 2012

(30) Foreign Application Priority Data

Dec. 21, 2009  (DE) .................. 10 2009 059 878
Jan. 20, 2010  (DE) .................. 10 2010 005 169

(51) Int. Cl.
| H01L 33/00 | (2010.01) |
| H01L 33/50 | (2010.01) |
| H01L 33/20 | (2010.01) |
| H01L 33/08 | (2010.01) |
| H01L 33/02 | (2010.01) |
| H01L 33/58 | (2010.01) |

(52) U.S. Cl.
CPC ............ *H01L 33/50* (2013.01); *H01L 33/025* (2013.01); *H01L 33/08* (2013.01); *H01L 33/20* (2013.01); *H01L 33/58* (2013.01); *H01L 2924/0002* (2013.01); *H01L 2933/0091* (2013.01)

(58) Field of Classification Search
CPC ....... H01L 33/20; H01L 33/50; H01L 33/025; H01L 33/08
USPC .............................. 257/98, E33.061, E33.074
See application file for complete search history.

(56) References Cited

U.S. PATENT DOCUMENTS

| 7,078,732 B1 | 7/2006 | Reeh et al. |
| 2004/0188689 A1 | 9/2004 | Shono et al. |
| (Continued) | | |

FOREIGN PATENT DOCUMENTS

| DE | 103 51 397 A1 | 6/2005 |
| DE | 10 2006 061 175 A1 | 6/2008 |
| (Continued) | | |

OTHER PUBLICATIONS

Bergenek K. et al., "Strong High Order Diffraction of Guided Modes in Micro-Cavity Light-Emitting Diodes with Hexagonal Photonic Crystals," *IEEE Journal of Quantum Electronics*, vol. 45, No. 12, Dec. 2009.

*Primary Examiner* — Robert Huber
(74) *Attorney, Agent, or Firm* — DLA Piper LLP (US)

(57) ABSTRACT

A radiation-emitting semiconductor component includes a semiconductor body having an active layer which emits electromagnetic radiation of a first wavelength $\lambda_1$ in a main radiation direction, and having a luminescence conversion layer, which converts at least part of the emitted radiation into radiation of a second wavelength $\lambda_2$, which is greater than the first wavelength $\lambda_1$.

10 Claims, 6 Drawing Sheets

(56) References Cited

U.S. PATENT DOCUMENTS

| | | |
|---|---|---|
| 2005/0151141 A1 | 7/2005 | Grotsch et al. |
| 2005/0285132 A1 | 12/2005 | Orita |
| 2008/0079015 A1 | 4/2008 | Krummacher |
| 2008/0116467 A1 | 5/2008 | Mueller et al. |
| 2009/0173958 A1 | 7/2009 | Chakraborty et al. |
| 2009/0278147 A1 | 11/2009 | Suzuki |
| 2011/0205740 A1 | 8/2011 | Rindt et al. |

FOREIGN PATENT DOCUMENTS

| | | |
|---|---|---|
| DE | 10 2008 021 621 A1 | 11/2009 |
| DE | 10 2008 030 751 A1 | 12/2009 |
| DE | 10 2008 021 436 A1 | 5/2010 |
| EP | 1 906 462 A2 | 8/2007 |
| WO | 97/50132 | 12/1997 |
| WO | 2009/155899 A1 | 12/2009 |

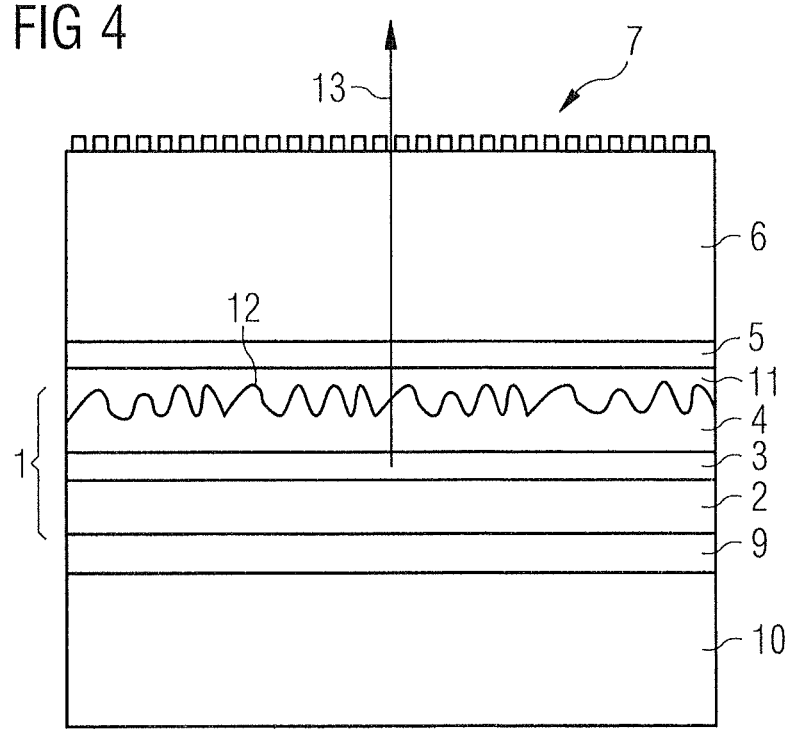
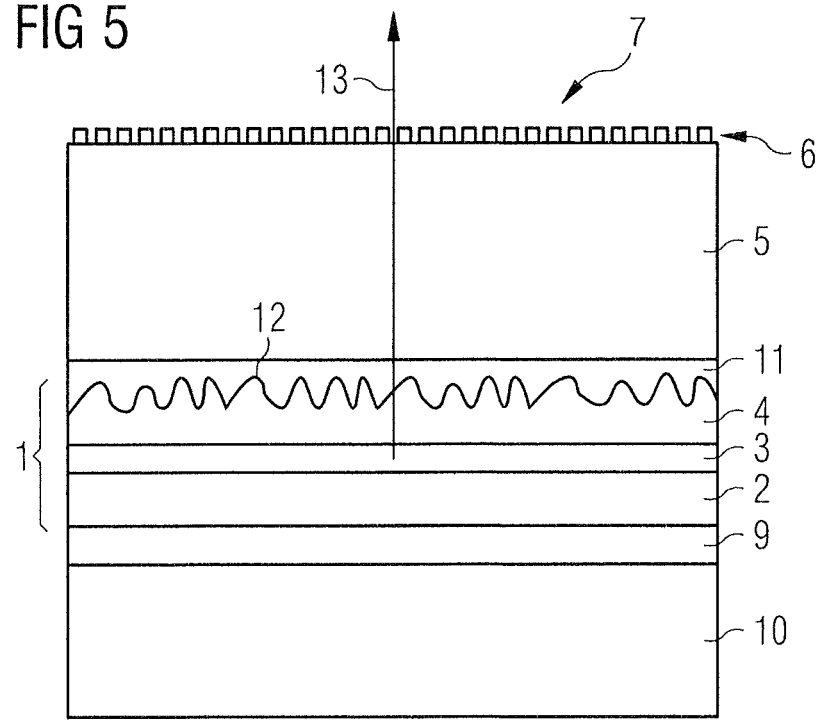

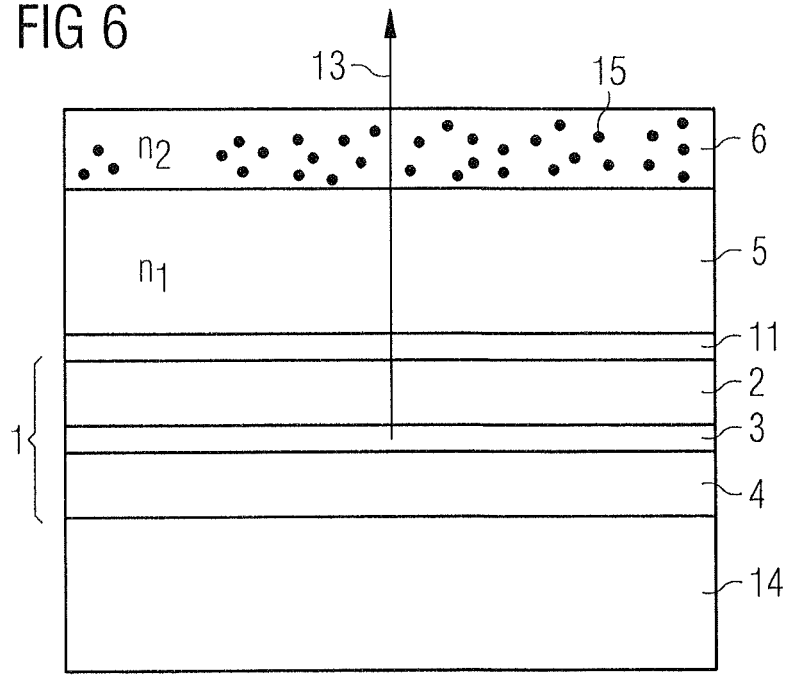
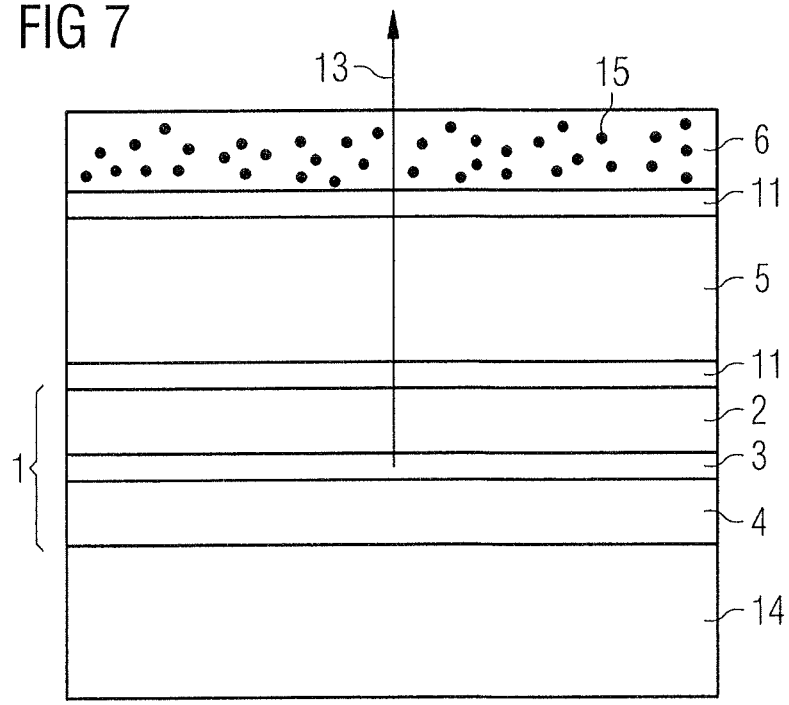

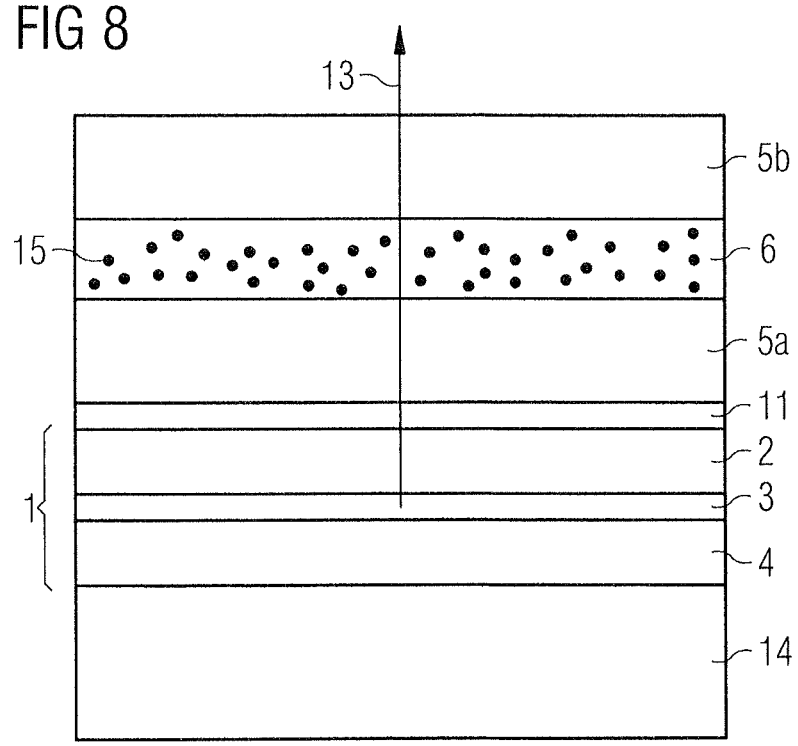
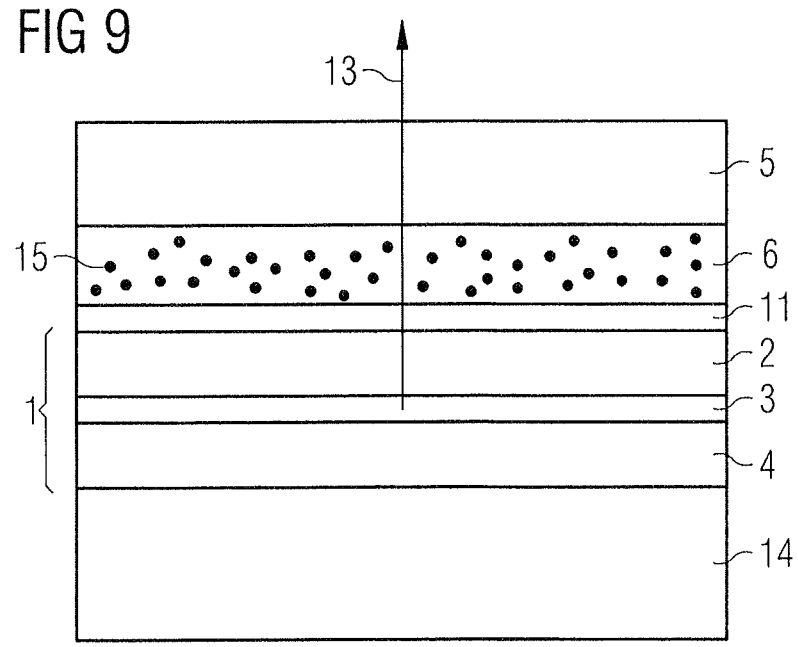

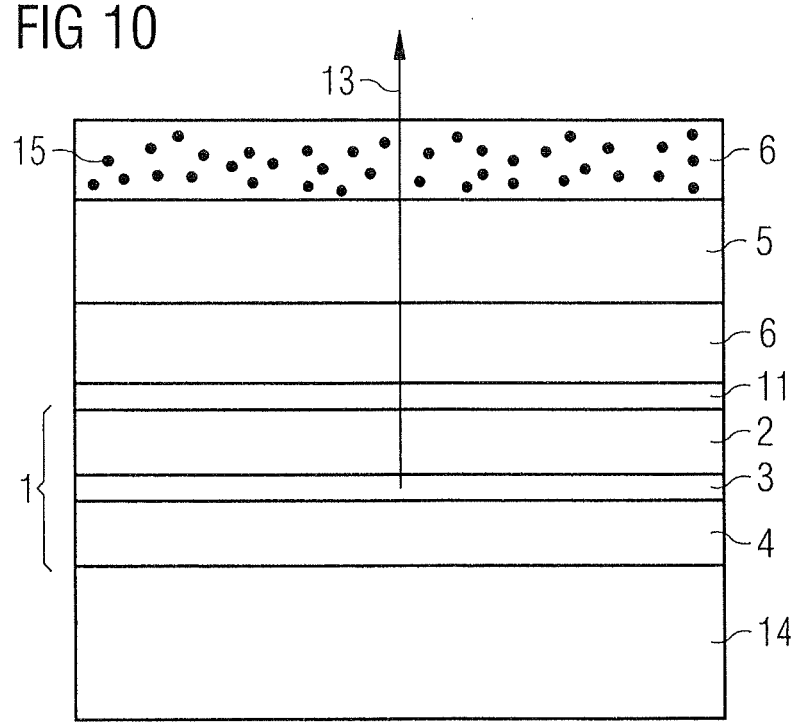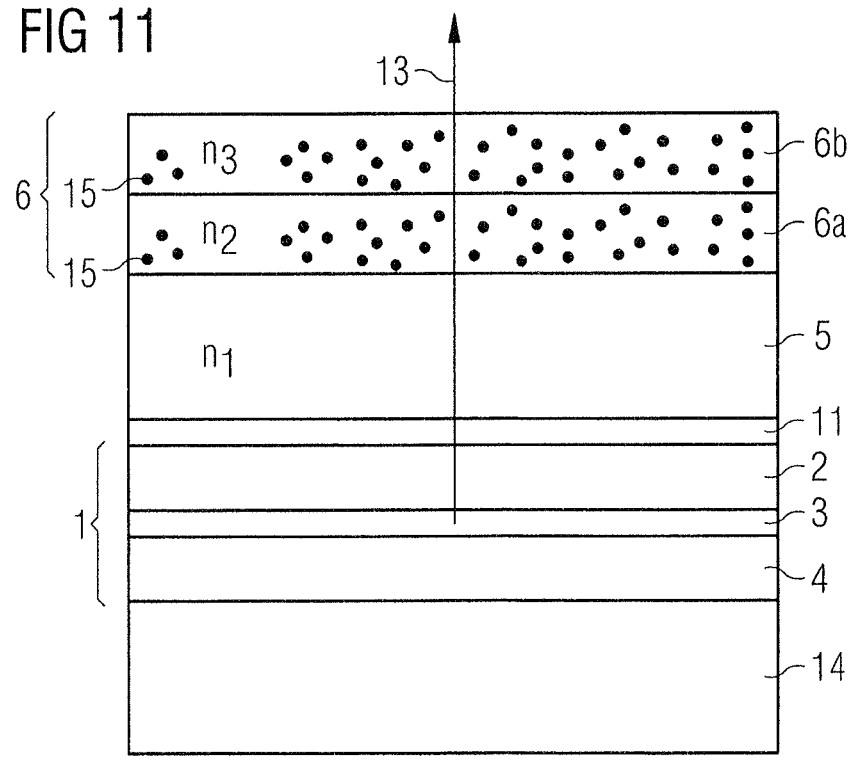

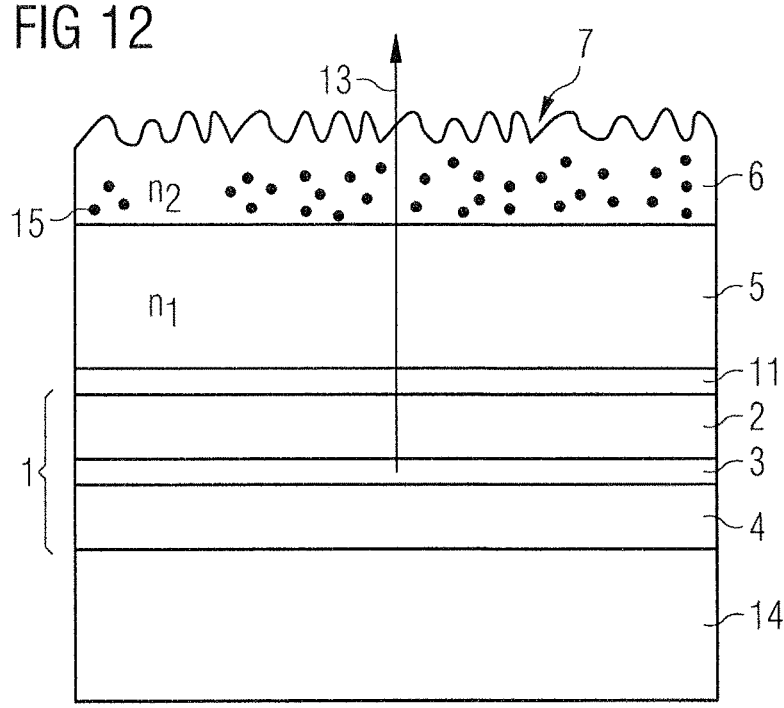
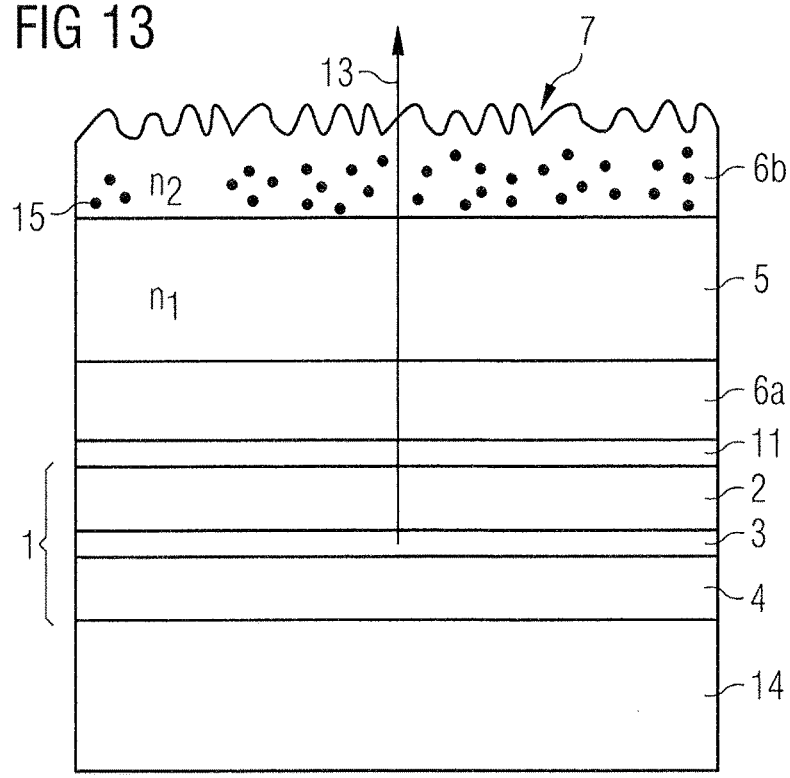

US 9,842,972 B2

RADIATION-EMITTING SEMICONDUCTOR COMPONENT

RELATED APPLICATIONS

This is a §371 of International Application No. PCT/EP2010/069509, with an international filing date of Dec. 13, 2010 (WO 2011/085889 A1, published Jul. 21, 2011), which is based on German Patent Application No. 10 2009 059 878.2 filed Dec. 21, 2009 and German Patent Application No. 10 2010 005 169.1 filed Jan. 20, 2010, the subject matter of which is incorporated herein by reference.

TECHNICAL FIELD

This disclosure relates to a radiation-emitting semiconductor component, in particular an LED comprising a luminescence conversion layer.

BACKGROUND

LEDs based on the principle of luminescence conversion can be produced by a luminescence conversion layer applied to a radiation-emitting semiconductor chip, the luminescence conversion layer converting part of the radiation emitted by the semiconductor chip and having a first wavelength into radiation having a second wavelength, which is greater than the first wavelength. The luminescence conversion layer can contain a luminescence conversion substance, for example, which converts ultraviolet or blue light emitted by a semiconductor chip at least partly into yellow light such that white mixed light arises as a result of the superimposition of the emitted ultraviolet or blue radiation and the converted yellow radiation.

An LED based on the principle of luminescence conversion and suitable luminescence conversion substances are known from WO 97/50132, for example.

The luminescence conversion substance is typically incorporated into an organic material such as, for example, an epoxy resin or silicone, wherein the luminescence conversion layer is applied as a potting compound to the semiconductor chip.

In the case of LEDs based on the principle of luminescence conversion, an undesirable angle dependence of the color locus can occur. This is owing to the fact that radiation emitted at large angles of emergence covers a longer distance through the luminescence conversion layer and a larger proportion of the emitted ultraviolet or blue radiation is thus converted into yellow light.

A further undesirable effect for specific applications is that the luminescence conversion layer affords an undesirable yellow color impression in the switched-off state of the LED.

It could therefore be helpful to provide a radiation-emitting semiconductor component comprising a luminescence conversion layer which is distinguished by improved radiation coupling-out, improved color mixing and/or directionality of the emitted radiation.

SUMMARY

We provide a radiation-emitting semiconductor component including a semiconductor body having an active layer which, during operation, emits electromagnetic radiation having a first wavelength $\lambda_1$ in a main radiation direction, a luminescence conversion layer which converts at least part of the emitted radiation into radiation having a second wavelength $\lambda_2$ greater than the first wavelength $\lambda_1$, and a functional layer that improves radiation coupling-out, color mixing and/or angle dependence of the emitted radiation, wherein the functional layer succeeds the active layer in the main radiation direction and contains a glass, a ceramic, a glass ceramic or sapphire.

We also provide a radiation-emitting semiconductor component including a semiconductor body having an active layer which, during operation, emits electromagnetic radiation having a first wavelength $\lambda_1$ in a main radiation direction, a luminescence conversion layer which converts at least part of the emitted radiation into radiation having a second wavelength $\lambda_2$ greater than the first wavelength $\lambda_1$, and a functional layer that improves radiation coupling-out, color mixing and/or angle dependence of the emitted radiation, wherein the functional layer succeeds the active layer and the luminescence conversion layer in the main radiation direction and contains a glass, a ceramic, a glass ceramic or sapphire, and the functional layer has a periodic surface structuring.

BRIEF DESCRIPTION OF THE DRAWINGS

FIGS. 4 to 13, respectively, show a schematic illustration of a cross section through a radiation-emitting semiconductor component in accordance with further examples.

DETAILED DESCRIPTION

Figure 1:
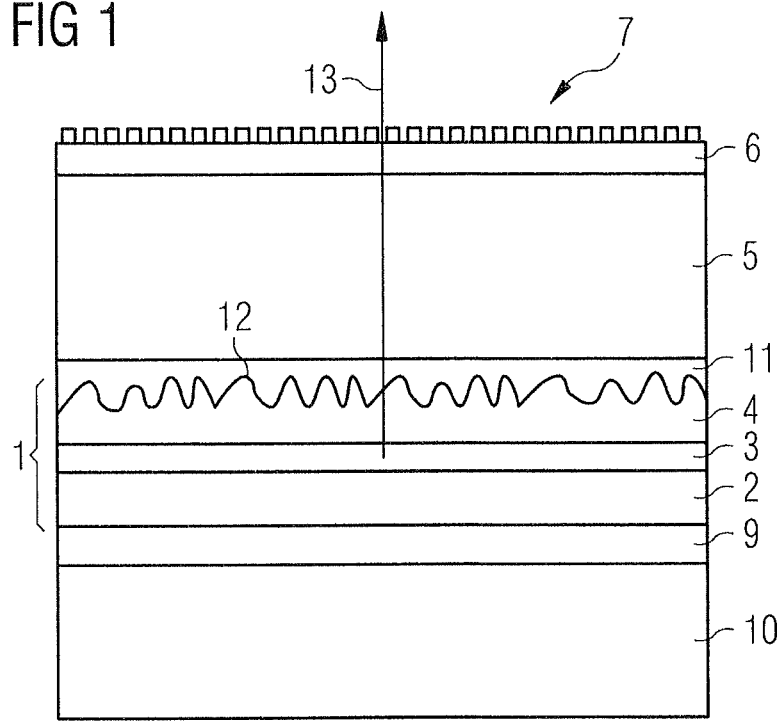
FIG. 1 shows a schematic illustration of a cross section through a radiation-emitting semiconductor component in accordance with a first example.

Our radiation-emitting semiconductor component may comprise a semiconductor body containing an active layer, which, during operation, emits electromagnetic radiation having a first wavelength $\lambda_1$ in a main emission direction. The radiation-emitting semiconductor component can be, in particular, an LED. The active layer can be embodied, for example, as a pn junction, as a double heterostructure, as a single quantum well structure or multiple quantum well structure. The designation "quantum well structure" in this case encompasses any structure in which charge carriers experience a quantization of their energy states as a result of confinement. In particular, the designation quantum well structure does not include any indication about the dimensionality of the quantization. It therefore encompasses, inter alia, quantum wells, quantum wires and quantum dots and any combination of these structures.

The semiconductor body can be based on a nitride compound semiconductor, in particular. In this context, "based on a nitride compound semiconductor" means that the semiconductor layer sequence or at least one layer thereof comprises a III nitride compound semiconductor material, preferably $In_xAl_yGa_{1-x-y}N$, where $0 \leq x \leq 1$, $0 \leq y \leq 1$ and $x+y \leq 1$. In this case, this material need not necessarily have a mathematically exact composition according to the above formula. Rather, it can comprise one or a plurality of dopants and additional constituents which substantially do not change the characteristic physical properties of the $In_xAl_yGa_{1-x-y}N$ material. For the sake of simplicity, however, the above formula only includes the essential constituents of the crystal lattice (In, Al, Ga, N), even if they can be replaced in part by small amounts of further substances.

The active layer of the semiconductor body preferably emits ultraviolet or blue radiation during operation of the semiconductor component.

Furthermore, the radiation-emitting semiconductor component contains a luminescence conversion layer which converts at least part of the emitted radiation having the first wavelength $\lambda_1$ into radiation having a second wavelength $\lambda_2$, which is greater than the first wavelength $\lambda_1$. The luminescence conversion layer can comprise, in particular, a luminescence conversion substance suitable for converting blue or ultraviolet light at least partly into yellow light. Suitable luminescence conversion substances are known from WO 97/50132 cited above, for example, the subject matter of which is incorporated herein by reference. The luminescence conversion layer can comprise at least one further luminescence conversion substance which converts radiation emitted by the active layer into radiation having at least one further wavelength. A plurality of conversion substances can be used, in particular, to set the color locus of the mixed radiation in a targeted manner, for example, for generating warm-white light.

Furthermore, the radiation-emitting semiconductor component contains a functional layer to improve the radiation coupling-out, color mixing and/or angle dependence of the emitted radiation. The functional, layer succeeds the active layer in the main radiation direction and preferably contains a glass, a ceramic, a glass ceramic or sapphire. The functional layer composed of one of the materials can be, in particular, a self-supporting layer which can advantageously serve as a mechanically stable carrier for further layers. Preferably, the functional layer is a dimensionally stable layer which can advantageously be produced and structured independently of the semiconductor body to subsequently connect it to the semiconductor body and/or the luminescence conversion layer.

The functional layer preferably succeeds the luminescence conversion layer in the main radiation direction. In particular, the functional layer can directly adjoin the luminescence conversion layer. The functional layer preferably comprises the radiation coupling-out area of the radiation-emitting semiconductor component, that is to say that it is advantageously the outermost layer of the radiation-emitting semiconductor component as seen in the main radiation direction.

Preferably, the luminescence conversion layer has a refractive index $n_1$ and the functional layer has a refractive index $n_2$, where $n_2 \leq n_1$ holds true.

In one configuration, the refractive index $n_2$ of the functional layer is adapted to the refractive index $n_1$ of the luminescence conversion layer. In this case, the refractive indices $n_1$ and $n_2$ are identical or different only slightly from one another, advantageously by $\Delta n = |n_2 - n_1| \leq 0.3$ and preferably by $\Delta n \leq 0.1$. Particularly preferably, $n_2 = n1 - \Delta n$ where $0 \leq \Delta n \leq 0.1$, i.e. $n_2$ is slightly less than or equal to $n_1$.

Reflection losses during transition of the emitted radiation from the luminescence conversion layer into the downstream functional layer are advantageously avoided in this way. This is advantageous particularly when the functional layer has, at a surface facing away from the luminescence conversion layer, a surface structure to improve the radiation coupling-out. In this case, as a result of the adaptation of the refractive index of the functional layer to the refractive index of the luminescence conversion layer, reflection losses at the interface between the luminescence conversion layer and the functional layer are minimized, while reflection losses at the interface between the functional layer and the surrounding medium are reduced by the surface structuring of the functional layer.

Alternatively, the refractive index $n_2$ of the functional layer is less than the refractive index $n_1$ of the luminescence conversion layer. In this case, reflection losses at the interface between the functional layer and the surrounding medium are advantageously smaller than if a direct transition from the refractive index of the luminescence conversion layer to the refractive index of the surrounding medium, such as air, in particular, were effected.

It is also possible for the functional layer to comprise two or more partial layers, wherein the refractive indices of the partial layers decrease from partial layer to partial layer in the main radiation direction. Furthermore, it is also possible for the functional layer to have a material composition that varies continuously in the main radiation direction such that the functional layer has a refractive index gradient in which the refractive index decreases continuously in the main radiation direction. In these configurations, reflection losses as a result of abrupt changes in the refractive index are reduced and the coupling-out efficiency of the radiation-emitting semiconductor component is thus improved.

Preferably, the luminescence conversion layer comprises a ceramic. The ceramic can be, in particular, YAG:Ce or LuAG:Ce. Furthermore, Eu-doped nitrides or oxynitrides are also suitable. Alternatively, the luminescence conversion layer can also comprise a glass or a glass ceramic into which the luminescence conversion substance is incorporated.

Suitable ceramics for the functional layer are, in particular, aluminum oxide ($n_2=1.76$-$1.77$), aluminum oxynitride ($n_2=1.77$-$1.80$), magnesium-aluminum spinel ($n_2=1.73$), silicon dioxide ($n_2=1.46$) or silicon oxynitride ($n_2=1.47$). Suitable glasses for the functional layer are, in particular, quartz glass ($n_2=1.46$), amorphous germanium oxide ($GeO_2$, $n_2=1.61$), soda-lime glass ($n_2=1.52$), silicate glass ($n_2=1.50$) or borosilicate glass ($n_2=1.47$). The ceramics and glasses mentioned each have a refractive index that is approximately equal to the refractive index of the ceramic YAG:Ce ($n_1=1.81$) suitable for the luminescence conversion layer, for example, or is less than the refractive index. The glass can also be a spin-on glass. Alongside ceramics and glasses, glass ceramics are also suitable for the functional layer.

The luminescence conversion layer and the functional layer can be connected to one another in particular by sintering and/or fusion. In this case, the connection is advantageously effected in a manner free of adhesion promoter, that is to say that advantageously no connecting layer such as an adhesive layer, for example, is arranged between the functional layer and the luminescence conversion layer. Radiation losses as a result of reflection or scattering which could occur in the case of an adhesive layer arranged between the luminescence conversion layer and the functional layer are prevented in this way.

However, the luminescence conversion layer and the functional layer can alternatively also be connected to one another by a chemical compound, in particular by a connecting layer composed of a transparent material such as, for example, silicone or some other transparent casting resin. In this way, for example, the luminescence conversion layer can also be connected to the semiconductor body.

Preferably, the functional layer has a surface structuring. The surface structuring is advantageously formed at that surface of the functional layer which faces away from the luminescence conversion layer and which constitutes, in particular, the radiation exit area of the radiation-emitting semiconductor component. The surface structuring makes it possible to reduce, in particular, reflection losses at the interface between the functional layer and the surrounding medium, as a result of which the radiation coupling-out and thus the efficiency of the radiation-emitting semiconductor component are improved.

The surface structuring preferably has a depth of 100 nm to 10 µm. By way of example, cutouts can be formed at the surface of the functional layer, the cutouts preferably extending right into the functional layer to an extent of 100 nm to 10 µm.

Preferably, the surface structuring has a periodic structure. The periodic structure can have a one- or two-dimensional periodicity, but three-dimensional structures are also possible. In particular, the periodic structure can have a period d that is on the order of magnitude of the wavelength of the emitted radiation. In this case, the periodic structure forms a so-called "photonic crystal".

It is particularly advantageous if the period structure has a period d and the functional layer has a refractive index $n_2$, where the following holds true: $\pi/\lambda_2 < G < n_2 \cdot 2\pi/\lambda_2$. In this case, $\lambda_2$ is the wavelength of the converted radiation and $G=2\pi/d$ in the case of a one-dimensional lattice structure and $G=4\pi/\sqrt{3}d$ in the case of a two-dimensional, in particular hexagonal, lattice structure.

We found that, given such a choice of the period d of the periodic structure, it is possible to obtain a directional emission in a main radiation direction which is perpendicular to the surface of the functional layer.

The surface structuring can alternatively also be a roughening. In this case, the surface structuring thus has a non-periodic structure. In this case, the surface structuring can be produced by an etching process, in particular.

Further preferably, the functional layer comprises scattering particles or pores.

As a result of light scattering at the scattering particles or pores in the functional layer, the color mixing between the radiation emitted by the semiconductor body and that emitted by the conversion substance is improved and, in particular, the angle dependence of the color locus is reduced in this way.

The luminescence conversion layer itself advantageously has no scattering particles. In the case of desired light scattering, therefore, the scattering particles and/or a light-scattering structure are/is preferably arranged or formed only in the functional layer. This has the advantage that the efficiency of the luminescence conversion in the luminescence conversion layer is not impaired by the scattering particles.

The functional layer may comprise two or more partial layers, wherein the concentration of the scattering particles or pores of the partial layers decreases from partial layer to partial layer in the main radiation direction. Furthermore, it is also conceivable for the functional layer to have a concentration of scattering particles or pores that decreases continuously in the main radiation direction.

The functional layer may be a partial layer of the luminescence conversion layer. In this case, the functional layer is preferably formed at a surface of the luminescence conversion layer which faces away from the active layer. In particular, that surface of the luminescence conversion layer which faces away from the active layer can be provided with the surface structuring described above. In contrast to the previously described examples in which the functional layer is a separate layer different from the luminescence conversion layer, the example of the functional layer at the surface of the luminescence conversion layer has the advantage that it is not necessary for two separate elements to be connected to one another.

In contrast, a functional layer different than the luminescence conversion layer has the advantage that it is possible to select a different material for the functional layer than for the luminescence conversion layer such that the material parameters such as, in particular, the refractive index of the functional layer can be selected in a targeted manner.

Our components are explained in greater detail below on the basis of examples in association with FIGS. 1 to 13.

Identical or identically acting constituent parts are provided with the same reference symbols in the figures. The sizes of the constituent parts and also the size relationships of the constituent parts among one another should not be regarded as true to scale.

The examples of a radiation-emitting semiconductor component as illustrated in FIG. 1 comprises a semiconductor body 1 containing a radiation-emitting active layer 3. The active layer 3 can be, in particular, a pn junction, a single quantum well structure or a multiple quantum well structure. The active layer can emit, in particular, radiation in the ultraviolet or blue spectral range. In particular, the active layer can be formed from a nitride compound semiconductor material. The active layer is arranged, for example, between a p-type semiconductor region 2 and an n-type semiconductor region 4.

The semiconductor body 1 is a so-called "thin-film" semiconductor body, wherein a growth substrate used for the growth of the semiconductor layers 2, 3, 4 has been detached from the semiconductor body 1. At a side lying opposite the original growth substrate, the semiconductor body 1 is connected to a carrier body 10.

A mirror layer 9 is preferably arranged between the semiconductor body 1 and the carrier body 10, which mirror layer can simultaneously serve for making electrical contact with the semiconductor body 1. The mirror layer 9 can contain, in particular, Ag or Al. A further electrical contact layer (not illustrated) can be applied, for example, to a partial region of that surface 12 of the semiconductor body 1 which faces away from the carrier body 10. Even further layers (not illustrated) can be arranged between the carrier body 10 and the semiconductor body 1, in particular a solder layer for connecting the semiconductor body 1 to the carrier body 10.

That surface 12 of the semiconductor body 1 which faces away from the carrier body 10 advantageously has a surface structuring for improving the radiation coupling-out from the semiconductor body 1.

Electromagnetic radiation having an intensity maximum at a wavelength $\lambda_1$ is emitted from the active layer 3 of the semiconductor body 1 in a main radiation direction 13. A luminescence conversion layer 5 is disposed downstream of the active layer in the main radiation direction 13, and converts at least part of the emitted radiation into radiation having an intensity maximum at a second wavelength $\lambda_2$, which is greater than the first wavelength $\lambda_1$. In particular, the luminescence conversion layer 5 can convert blue or ultraviolet light emitted by the active layer 3 into yellow light such that superimposition of the complementary colors produces white light.

The luminescence conversion layer 5 is preferably a self-supporting layer which can be formed, in particular, from an inorganic material. Preferably, the luminescence conversion layer 5 comprises a glass, a ceramic or a glass ceramic. In particular, the luminescence conversion layer 5 can comprise Ce-doped garnets such as, for example YAG:

Ce or LuAG:Ce. Furthermore, Eu-doped nitrides or oxynitrides such as e.g. $Sr_2Si_5N_8$, $Ba_2Si_5N_8$, $Ca_2Si_5N_8$, Sr—SiON, Ba—SiON or Ca-α-SiAlON are also suitable.

The luminescence conversion layer 5 connects to the semiconductor body 1, for example, by a connecting layer 11. The connecting layer 11 can be, in particular, a transparent layer composed of silicone or some other casting resin such as, for example, epoxy resin.

By virtue of the fact that the luminescence conversion layer 5 is a self-supporting layer composed of a preferably inorganic material, it can advantageously serve as a carrier for a further layer. A functional layer 6 is disposed downstream of the luminescence conversion layer 5 in the main radiation direction 13. The functional layer 6 serves, in particular, to improve radiation coupling-out from the luminescence conversion layer 5. Like the luminescence conversion layer 5, the functional layer 6 is advantageously formed from an inorganic material, in particular from a ceramic, a glass or a glass ceramic. Suitable ceramics for the functional layer 6 are, for example, aluminum oxide ($Al_2O_3$), aluminum oxynitride (AlON), magnesium-aluminum spinel ($MgAl_2O_3$), silicon dioxide ($SiO_2$) or silicon oxynitride (SiON). Suitable glasses for the functional layer 6 are, in particular, quartz glass, amorphous germanium oxide (fused germania), soda-lime glass, silicate glass or borosilicate glass. These ceramics and glasses are distinguished, in particular, by the fact that the refractive index is less than the refractive index of YAG:Ce, which is particularly suitable as a material for the luminescence conversion layer.

The functional layer 6 applied to the luminescence conversion layer 5 is advantageously less than 100 μm thick, for example, 10 μm to 100 μm. Preferably, the luminescence conversion layer 5 and the functional layer 6 directly adjoin one another and connect to one another in a manner free of adhesion promoters, that is to say that advantageously no connecting layer is contained between the luminescence conversion layer 5 and the functional layer 6. In this case, the functional layer 6 and the luminescence conversion layer 5 can be connected to one another by sintering or fusion, for example.

It is advantageous if the refractive index $n_2$ of the functional layer 6 is adapted to the refractive index $n_1$ of the luminescence conversion layer 5, where preferably $\Delta n = |n_2 - n_1| \leq 0.3$ holds true. Particularly preferably, $\Delta n \leq 0.1$ holds true. If the refractive indices of the luminescence conversion layer 5 and of the functional layer 6 are at least approximately identical, no or only slight reflection losses occur at the interface between the luminescence conversion layer 5 and the functional layer 6. In this case, a jump in refractive index with respect to the surrounding medium takes place substantially at the interface between the functional layer 6 and the surrounding medium, in particular air. To reduce reflection losses and thus to improve radiation coupling-out from the functional layer 6, the functional layer 6 has a surface structuring 7. The surface structure 7 preferably has a depth of 100 nm to 10 μm.

The surface structuring 7 can be a roughening of the surface of the functional layer 6, which is produced by an etching process, for example. In the case of this configuration, the surface structuring 7 is a non-periodic structure.

Figure 2:
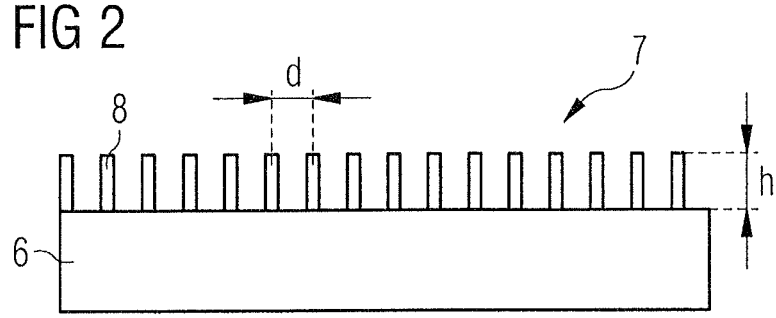
FIG. 2 shows a schematic illustration of a cross section through the functional layer in a further example.
Figure 3:
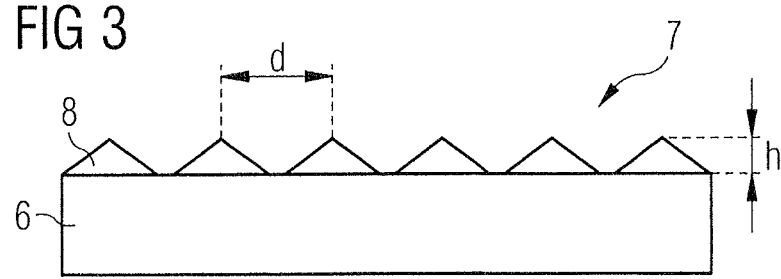
FIG. 3 shows a schematic illustration of a cross section through the functional layer in a still further example.

Preferably, the surface structuring 7 of the functional layer 6 is a periodic structure. Examples of a functional layer 6 having such periodic structure 7 are illustrated in FIGS. 2 and 3. The periodic structure 7 has structure elements 8 arranged in a one-dimensional or multidimensional lattice having a period d. The structure elements 8 can be, for example, elevations or depressions such as, e.g. ridges, grooves or holes. The structure elements 8 can be produced, for example, by photolithography at the surface of the functional layer 6. Preferably, the structure elements 8 have a height h of 100 nm to 10 μm. The period d of the periodic structure 7 is preferably the order of magnitude of the wavelength of the emitted radiation, such that the periodic structure 7 forms a so-called "photonic" crystal.

It is particularly advantageous if the periodic structure 7 has a period d and the functional layer 6 has a refractive index $n_2$, where the following holds true: $\pi/\lambda_2 < G < n_2 \, 2\pi/\lambda_2$. In this case, $\lambda_2$ is the wavelength of the converted radiation and $G = 2\pi/d$ in the case of a one-dimensional lattice structure and $G = 4\pi/\sqrt{3}d$ in the case of a two-dimensional, in particular hexagonal, lattice structure.

We found that with a period d in this range, it is possible to obtain a directional emission, that is to say that the angular distribution of the emitted radiation is concentrated around the main emission direction 13 to a greater extent than, for example, in the case of a non-periodically structured functional layer 6.

Alternatively, the surface structuring 7 can also be formed by microprisms or microlenses. In this case, the structure elements 8 are typically larger than the wavelength $\lambda_2$ of the emitted radiation.

The example of a radiation-emitting semiconductor component as illustrated in FIG. 4 differs from the example illustrated in FIG. 1 in that the luminescence conversion layer 5 is a layer produced by a PVD (physical vapor deposition) method. In particular, the luminescence conversion layer 5 can be a layer produced by pulsed laser deposition (PLD). The luminescence conversion layer 5 can be deposited, in particular, onto the functional layer 6, that is to say that the functional layer 6 functions as a substrate for applying the luminescence conversion layer 5 by a PVD method. For this purpose, the functional layer 6 is formed from a preferably inorganic material having a sufficiently mechanical stability such that it can be used as a self-supporting substrate. In particular, the functional layer 6 can be a sapphire substrate. Alternatively, it is also possible for the functional layer 6, as in the case of the example described in FIG. 1, to be formed from a glass, a ceramic or a glass ceramic. The functional layer 6 has a surface structuring 7, which serves, in particular, to improve radiation coupling-out and can be configured as described in association with FIGS. 1 to 3.

In a production method for producing the semiconductor component, by way of example, first a surface of the functional layer 6 can be provided with a surface structuring 7 and afterward the luminescence conversion layer 5 can be deposited onto the surface lying opposite the surface structuring 7. Alternatively, these method steps can also be carried out in the opposite order. The combination—produced separately in this way—of functional layer 6 and luminescence conversion layer 5 can be connected to the semiconductor body 1 of the radiation-emitting semiconductor component by a connecting layer 11, for example, in a further method step.

Further details and advantageous configurations of the example illustrated in FIG. 4 correspond to the example illustrated above in FIG. 1 and will therefore not be explained in greater detail again.

In the case of the example illustrated in FIG. 5, as in the case of the example illustrated in FIG. 1, a luminescence conversion layer 5 is connected to the semiconductor body 1 of the radiation-emitting semiconductor component by a connecting layer 11. The luminescence conversion layer 5 is a self-supporting layer preferably formed from a glass, a ceramic or a glass ceramic. The luminescence conversion layer 5 has a surface structuring 7 at its surface, the surface structuring 7, in particular, to improve the radiation coupling-out from the luminescence conversion layer 5. In this case, the surface structuring 7 of the luminescence conversion layer 5 functions as a functional layer 6. In this case, therefore, the functional layer 6 is not produced as a separate layer, but rather is in the form of a surface structuring 7 in the luminescence conversion layer 5.

With regard to further details and advantageous configurations, the example illustrated in FIG. 5 corresponds to the example illustrated in FIG. 1.

The radiation-emitting semiconductor component illustrated in FIG. 6 is a luminescence diode comprising a semiconductor body 1 containing a radiation-emitting active layer 3. The active layer 3 is arranged, for example, between an n-type semiconductor region 4 and a p-type semiconductor region 2. The semiconductor layers 2, 3, 4 of the semiconductor body 1 may have been grown on a growth substrate 14. Alternatively, it is also possible for the semiconductor body 1 to be a thin-film semiconductor body in which the growth substrate 14 has been detached and the semiconductor body 1 has instead been arranged on a carrier body different than the growth substrate 14, as is the case in the in FIG. 1.

A luminescence conversion layer 5 is disposed downstream of the radiation-emitting active layer 3 in the main radiation direction 13. The luminescence conversion layer 5 is advantageously formed from a glass, a ceramic or a glass ceramic. The luminescence conversion layer 5 comprises a luminescence conversion substance which converts part of the radiation emitted by the active layer 3 and having an intensity maximum at a first wavelength $\lambda_1$ into radiation having an intensity maximum at a second wavelength $\lambda_2$, wherein the wavelength $\lambda_2$ is greater than the wavelength $\lambda_1$. The luminescence conversion layer can comprise, in particular, Ce-doped garnets such as YAG:Ce, LuAG:Ce or Eu-doped nitrides or oxynitrides. The luminescence conversion layer 5 is preferably a self-supporting layer which can be connected to the semiconductor body 1 by a connecting layer 11, for example.

A functional layer 6 succeeds the luminescence conversion layer 5 in the main radiation direction 13. The functional layer 6 preferably has a refractive index $n_2$ that is less than the refractive index $n_1$ of the luminescence conversion layer 5. This reduces an abrupt jump in refractive index from the refractive index $n_1$ of the luminescence conversion layer 5 to the surrounding medium by at least one intermediate step and in this way improves radiation coupling-out from the radiation-emitting semiconductor component.

In one advantageous configuration, the functional layer 6 comprises scattering particles 15. Instead of scattering particles 15, which have, in particular, a higher refractive index than the surrounding material of the functional layer 6, the functional layer 6 can also comprise pores having a lower refractive index than the surrounding material of the functional layers. The scattering particles 15 or pores in the functional layer 6 bring about light scattering which advantageously reduces the angle dependence of the color locus of the emitted radiation. The scattering particles 15 can furthermore also scatter radiation impinging on the radiation-emitting semiconductor component from outside and in this way advantageously have the effect that the surface of the radiation-emitting semiconductor component appears white in the switched-off state. A possibly disturbing yellowish color impression of the luminescence conversion layer 5 in the switched-off state of the radiation-emitting semiconductor component is reduced in this way.

The functional layer 6 preferably comprises a base material which is a glass, a ceramic or a glass ceramic, into which, for example, the scattering particles 15 are embedded. The functional layer 6 can be connected to the luminescence conversion layer 5 by sintering or fusion, in particular. In this case, advantageously no additional connecting layer such as, for example, an adhesive layer is contained between the luminescence conversion layer 5 and the functional layer 6. The number of optically active interfaces which might possibly adversely influence the radiation coupling-out is reduced in this way.

Alternatively, however, it would also be conceivable for the functional layer 6 to be connected to the luminescence conversion layer 5 by a transparent connecting layer 11. This configuration is illustrated in FIG. 7. The connecting layer 11 between the functional layer 6 and the luminescence conversion layer 5 can in this case be a silicone or epoxy resin layer, for example. With a further connecting layer 11, which can likewise be a silicone or epoxy resin layer, the luminescence conversion layer 5 connects to the semiconductor body 1. Otherwise, the example illustrated in FIG. 7 corresponds to the example illustrated in FIG. 6.

In the case of the examples described above, the functional layer 6 is in each case arranged at the radiation coupling-out area of the radiation-emitting semiconductor component. However, variations of the radiation-emitting semiconductor component are also possible in which the functional layer 6 is not arranged or not only arranged at the radiation coupling-out area of the radiation-emitting semiconductor component.

In the case of the example illustrated schematically in FIG. 8, the functional layer 6 is arranged between a first partial layer 5a and a second partial layer 5b of the luminescence conversion layer. In this case, the functional layer 6 can contain, in particular, scattering particles 15, which scatter the light emitted from the active layer 3 and the first partial layer 5a of the luminescence conversion layer and thus bring about improved color mixing and a reduced angle dependence of the color locus. Otherwise, the example illustrated in FIG. 8 corresponds to the example illustrated in FIG. 6.

In the case of the example of a radiation-emitting semiconductor component as illustrated schematically in FIG. 9, the functional layer 6 is arranged between the semiconductor body 1 and the luminescence conversion layer 5. In this configuration, the functional layer 6 preferably has a refractive index lying between the refractive index of the semiconductor body 1 and the refractive index of the luminescence conversion layer 5. In this way, the functional layer 6 advantageously reduces reflection losses during the transition of the radiation from the semiconductor body 1 to the luminescence conversion layer 5. As in the case of the previous example, the functional layer 6 can contain scattering particles 15, for example, to alter the angular distribution of the radiation emitted by the active layer 3.

In the case of the example illustrated in FIG. 10, functional layers 6 are arranged both above and below the luminescence conversion layer 5 as seen in the main radiation direction 13. The functional layer 6 arranged above the luminescence conversion layer 5 in the main radiation direction 13 advantageously improves radiation coupling-out from the radiation-emitting semiconductor component and scattering particles 15 preferably contained therein result in a reduction of the angle dependence of the color locus and a white appearance of the luminescence conversion layer 5 in the switched-off state of the radiation-emitting semiconductor component. The advantageous properties and modes of operation of the functional layer 6 arranged above the luminescence conversion layer 5 therefore correspond to the example illustrated in FIG. 6. The functional layer 6 arranged below the luminescence conversion layer 5 in the main radiation direction 13 serves, as in the case of the example illustrated in FIG. 9, in particular, to reduce reflection losses at the interface between the semiconductor body 1 and the luminescence conversion layer 5. For this purpose, the functional layer 6 arranged below the luminescence conversion layer 5 advantageously has a refractive index lying between the refractive index of the semiconductor material and the refractive index of the luminescence conversion layer 5. Consequently, the advantages of a functional layer above the luminescence conversion layer 5 and of a functional layer 6 below the luminescence conversion layer 5 are realized jointly in the case of the example in FIG. 10.

In the case of the example illustrated schematically in FIG. 11, a functional layer 6 comprising a first partial layer 6a and a second partial layer 6b is disposed downstream of the luminescence conversion layer 5 in the main radiation direction 13. The first partial layer 6a of the functional layer 6, the first partial layer succeeding the luminescence conversion layer 5 in the main radiation direction 13, has a refractive index $n_2$ that is less than the refractive index $n_1$ of the luminescence conversion layer. The second partial layer 6b of the functional layer 6, the second partial layer succeeding the first partial layer 6a of the functional layer 6 in the main radiation direction 13, has a refractive index $n_3$ that is less than the refractive index $n_2$ of the first partial layer 6a. The transition from the refractive index $n_1$ of the luminescence conversion layer 5 to the refractive index of the surrounding medium thus advantageously does not take place abruptly, but rather in a plurality of steps. In this way, reflection losses at the radiation coupling-out side of the radiation-emitting semiconductor component can be reduced particularly effectively.

The first partial layer 6a and/or the second partial layer 6b of the functional layer 6 can comprise scattering particles 15 to improve color mixing of the radiation emitted by the active layer 3 and the radiation converted by the luminescence conversion layer 5 and/or to cause the radiation-emitting semiconductor component to appear white in the switched-off state as viewed from outside.

Concentration of the scattering particles 15 is advantageously lower in the first partial layer of the functional layer 6a than in the second partial layer 6b. The concentration of the scattering particles 15 therefore decreases from partial layer to partial layer of the functional layer 6 in the main radiation direction 13 or has within the functional layer 6 a gradient that falls continuously in the main radiation direction 13. The lower concentration of the scattering particles in the vicinity of the semiconductor body 1 and the luminescence conversion layer 5 has the advantage of less backscattering of the emitted radiation, as a result of which the efficiency of the radiation-emitting semiconductor component is improved.

In the case of the example of a radiation-emitting semiconductor component as illustrated in FIG. 12, as in the case of the example illustrated in FIG. 6, a functional layer 6 having a refractive index $n_2$ is disposed downstream of the luminescence conversion layer 5 having the refractive index $n_1$ in the main radiation direction 13, where $n_2 \leq n_1$. In contrast to the example illustrated in FIG. 6, the functional layer 6 is provided with a surface structuring 7 at the surface facing away from the luminescence conversion layer 5. As a result of the surface structuring 7, in particular, reflection losses at the radiation coupling-out area of the radiation-emitting semiconductor component can be reduced further.

The surface structuring 7 can be produced by an etching process, in particular. In this case, the functional layer 6 is advantageously formed from a material having a greater etching rate than the luminescence conversion layer 5 in the etching method used. The luminescence conversion layer 5 is advantageously stable to the greatest possible extent with respect to the etching method. The surface structuring 7 can be a non-periodic structure or else a periodic structure. In the case of a periodic structure, the latter can form a photonic crystal, as explained, for example, in association with FIGS. 2 and 3.

The functional layer 6 can comprise scattering particles 15 to reduce the angle dependence of the color locus and/or to cause the luminescence conversion layer 5 to appear white as seen from outside, when the radiation-emitting semiconductor component is in the switched-off state. Furthermore, the surface structuring 7 can also have light-scattering properties such that, if appropriate, the scattering particles 15 can also be dispensed with.

The example of a radiation-emitting semiconductor component as illustrated in FIG. 13 comprises, like the semiconductor component illustrated in FIG. 12, a functional layer 6b having a surface structuring 7, which succeeds the luminescence conversion layer 5 in the main radiation direction 13. The difference with respect to the example illustrated in FIG. 12 is that a further partial layer 6a of the functional layer is additionally arranged below the luminescence conversion layer 5 as seen in the main radiation direction 13. As in the case of the examples illustrated in FIGS. 9 and 10, the second partial layer 6a arranged below the luminescence conversion layer 5 substantially serves to reduce reflection losses during the transfer of the radiation from the semiconductor body 1 into the luminescence conversion layer 5. For this purpose, the partial layer 6a of the functional layer arranged below the luminescence conversion layer 5 preferably has a refractive index lying between the refractive indices of the semiconductor body 1 and of the luminescence conversion layer 5.

Both the first partial layer 6a arranged below the luminescence conversion layer 5 and the second partial layer 6b of the functional layer 6 arranged above the luminescence conversion layer 5 can each comprise scattering particles 15. In this case, it is advantageous if the first partial layer 6a has a lower concentration of scattering particles 15 than the second partial layer 6b. In particular, it is possible for only the second partial layer 6b of the functional layer to comprise scattering particles 15. What is advantageously achieved in this way is that the backscattering of radiation in the first partial layer 6b arranged below the luminescence conversion layer 6 is low.

Our components are not restricted by the description on the basis of the examples. Rather, the disclosure encompasses any novel feature and also any combination of features, which in particular includes any combination of features in the appended claims, even if the feature or combination itself is not explicitly specified in the claims or examples.

The invention claimed is:
1. A radiation-emitting semiconductor component comprising:
a semiconductor body having an active layer which, during operation, emits electromagnetic radiation having a first wavelength $\lambda_1$ in a main radiation direction, a luminescence conversion layer formed from a glass, a glass ceramic or a ceramic, and a refractive index $n_1$ and which converts at least part of the emitted radiation into radiation having a second wavelength $\lambda_2$ greater than the first wavelength $\lambda_i$, and a functional layer that improves angle dependence of the emitted radiation, wherein the functional layer 1) succeeds the active layer in the main radiation direction and contains a glass, a ceramic, a glass ceramic or sapphire, and 2) has a surface structuring, wherein the surface structuring has a periodic structure, and the periodic structure has a period d and the functional layer has a refractive index $n_2$, $\pi/\lambda_2 < G < n_2 \, 2\pi/\lambda_2$, where $G=2\pi/d$ in a one-dimensional periodic structure and $G=4\pi/\sqrt{3}$ in a two-dimensional hexagonal or periodic structure, and wherein $\Delta n = |n_2 - n_1| \leq 0.1$.

2. The radiation-emitting semiconductor component according to claim 1, wherein the functional layer succeeds the luminescence conversion layer in the main radiation direction.

3. The radiation-emitting semiconductor component according to claim 1, wherein the luminescence conversion layer has a refractive index $n_1$ and the functional layer has a refractive index $n_2$, where $n_2 \leq n_1$ holds true.

4. The radiation-emitting semiconductor component according to claim 1, wherein the functional layer comprises aluminum oxide, aluminum oxynitride, magnesium-aluminum spinel, silicon dioxide, silicon oxynitride, quartz glass, amorphous germanium oxide ($GeO_2$), soda-lime glass, silicate glass, borosilicate glass or a spin-on glass.

5. The radiation-emitting semiconductor component according to claim 1, wherein no connecting layer is arranged between the functional layer and the luminescence conversion layer.

6. The radiation-emitting semiconductor component according to claim 1, wherein the surface structuring has a depth of 100 nm to 10 μm.

7. The radiation-emitting semiconductor component according to claim 1, wherein the functional layer comprises pores or scattering particles.

8. The radiation-emitting semiconductor component according to claim 1, wherein the luminescence conversion layer comprises neither pores nor scattering particles.

9. The radiation-emitting semiconductor component according to claim 7, wherein the functional layer comprises at least two partial layers, and concentrations of the scattering particles in the partial layers decrease from partial layer to partial layer in the main radiation direction.

10. The radiation-emitting semiconductor component according to claim 1, wherein the functional layer comprises at least two partial layers, and refractive indices in the partial layers decrease from partial layer to partial layer in the main radiation direction.

* * * * *